(12) United States Patent
Matsui et al.

(10) Patent No.: US 10,854,825 B2
(45) Date of Patent: Dec. 1, 2020

(54) ORGANIC SEMICONDUCTOR ELEMENT

(71) Applicant: THE UNIVERSITY OF TOKYO, Tokyo (JP)

(72) Inventors: Hiroyuki Matsui, Tokyo (JP); Junichi Takeya, Tokyo (JP)

(73) Assignee: THE UNIVERSITY OF TOKYO, Tokyo (JP)

( * ) Notice: Subject to any disclaimer, the term of this patent is extended or adjusted under 35 U.S.C. 154(b) by 124 days.

(21) Appl. No.: 15/547,594

(22) PCT Filed: Jan. 27, 2016

(86) PCT No.: PCT/JP2016/052266
§ 371 (c)(1),
(2) Date: Dec. 4, 2017

(87) PCT Pub. No.: WO2016/121791
PCT Pub. Date: Aug. 4, 2016

(65) Prior Publication Data
US 2018/0145266 A1    May 24, 2018

(30) Foreign Application Priority Data
Jan. 29, 2015 (JP) ................................. 2015-015744

(51) Int. Cl.
*H01L 51/00* (2006.01)
*H01L 29/786* (2006.01)
(Continued)

(52) U.S. Cl.
CPC ............ *H01L 51/0074* (2013.01); *G01L 1/18* (2013.01); *H01L 29/786* (2013.01); *H01L 29/84* (2013.01);
(Continued)

(58) Field of Classification Search
CPC ... H01L 51/0074; H01L 29/786; H01L 29/84; H01L 51/0054; H01L 51/0055;
(Continued)

(56) References Cited

U.S. PATENT DOCUMENTS

| | | | |
|---|---|---|---|
| 2005/0211973 A1* | 9/2005 | Mori | .................... H01L 51/0012 257/40 |
| 2006/0145141 A1* | 7/2006 | Miura | .................. C07D 487/22 257/40 |

(Continued)

FOREIGN PATENT DOCUMENTS

| | | | |
|---|---|---|---|
| JP | 2005-166742 A | 6/2005 | |
| JP | 2011/086836 A | 4/2011 | |

(Continued)

OTHER PUBLICATIONS

English Translation of JP2011/242153 (Year: 2011).*
(Continued)

*Primary Examiner* — Dzung Tran
(74) *Attorney, Agent, or Firm* — Oliff PLC

(57) ABSTRACT

An organic semiconductor element functions as a strain sensor, and includes a substrate and an organic semiconductor layer formed on the substrate as a single-crystal thin film of an organic semiconductor that is a polycyclic aromatic compound with four or more rings or a polycyclic compound with four or more rings including one or a plurality of unsaturated five-membered heterocyclic compounds and a plurality of benzene rings. Since the organic semiconductor layer is formed as the single-crystal thin film, an identical crystal structure is obtained regardless of formation technique. Therefore, when the same strain is given, the same carrier mobility is obtained and uniform property is obtained with respect to the strain. Accordingly, it is possible to provide strain sensors having uniform property.

9 Claims, 4 Drawing Sheets

(51) Int. Cl.
*G01L 1/18* (2006.01)
*H01L 29/84* (2006.01)
*H01L 51/05* (2006.01)
*G01B 7/16* (2006.01)

(52) U.S. Cl.
CPC ...... *H01L 51/0054* (2013.01); *H01L 51/0055* (2013.01); *H01L 51/0073* (2013.01); *H01L 51/05* (2013.01); *G01B 7/16* (2013.01); *H01L 51/0007* (2013.01); *H01L 51/0097* (2013.01); *H01L 51/0545* (2013.01); *H01L 51/0566* (2013.01)

(58) Field of Classification Search
CPC . H01L 51/0073; H01L 51/05; H01L 51/0007; H01L 51/0097; H01L 51/0545; H01L 51/0566; G01L 1/18; G01B 7/16
USPC .......................................................... 257/40
See application file for complete search history.

(56) References Cited

U.S. PATENT DOCUMENTS

| | | | |
|---|---|---|---|
| 2006/0208251 A1* | 9/2006 | Yoshizawa | H01L 51/0504 257/40 |
| 2009/0194763 A1 | 8/2009 | Mino et al. | |
| 2009/0224231 A1 | 9/2009 | Takeuchi et al. | |
| 2009/0278116 A1* | 11/2009 | Yamate | H01L 51/0003 257/40 |
| 2010/0270542 A1* | 10/2010 | Zhu | H01L 51/0052 257/40 |
| 2012/0273770 A1* | 11/2012 | Sunagawa | C07D 487/04 257/40 |
| 2014/0312335 A1 | 10/2014 | Goto et al. | |

FOREIGN PATENT DOCUMENTS

| | | |
|---|---|---|
| JP | 2011-242153 A | 12/2011 |
| JP | WO2012/165612 A1 | 12/2012 |
| JP | 2013-58680 A | 3/2013 |
| JP | 2013-159584 A | 8/2013 |
| JP | 2014-049722 A | 3/2014 |
| JP | 2015-185620 A | 10/2015 |
| JP | WO2015/137304 A1 | 4/2017 |
| WO | 2006/046521 A1 | 5/2006 |
| WO | 2007/142238 A1 | 12/2007 |
| WO | 2013/065582 A1 | 5/2013 |

OTHER PUBLICATIONS

English Translation of JP2014/049722 (Year: 2014).*
Aug. 1, 2017 International Preliminary Report on Patentability issued in International Patent Application No. PCT/JP2016/052266.
Apr. 26, 2016 International Search Report issued in International Patent Application No. PCT/JP2016/052266.
Menard et al., "Micro- and Nanopatterning Techniques for Organic Electronic and Optoelectronic Systems," Chem. Rev., American Chemical Society, 2007, vol. 107, pp. 1117-1160.
K. Sakai et al., 18aFH-6 "Pressure effect of carrier transport properties on thiophene-based organic field effect transistors". Meeting abstracts of the Physical Society of Japan, vol. 67, No. 2, fourth fascicle, pp. 752, 2012.
Nov. 19, 2019 Office Action Issued in U.S. Appl. No. 16/502,174.
Mar. 16, 2020 Office Action issued in U.S. Appl. No. 16/502,174.

* cited by examiner

BEFORE COMPRESSIVE STRESS

AFTER COMPRESSIVE STRESS

ORGANIC SEMICONDUCTOR ELEMENT

TECHNICAL FIELD

The present disclosure relates to an organic semiconductor element.

BACKGROUND

Conventionally, as an organic semiconductor element of this type, there has been proposed an organic semiconductor element in which a compressive stress is applied to a multi-crystal or amorphous organic semiconductor (see Patent Literature 1, for example). In this device, the organic semiconductor is formed as a thin film on a bent substrate by a vapor deposition or a spin coating, and the compressive stress is applied to the organic semiconductor by stretching the bent substrate until the substrate becomes planar. With the compressive stress applied to the organic semiconductor, the carrier mobility of the organic semiconductor is increased.

CITATION LIST

Patent Literature

PTL 1: JP2005-166742

SUMMARY

However, in the above-described organic semiconductor element, since a multi-crystal or amorphous organic semiconductor is used, it is difficult to obtain organic semiconductors having an identical multi-crystal structure or an identical amorphous structure. Because of the difference in the structure, even when organic semiconductors are produced by the same technique and the same compressive stress is applied so that the same strain is given, the organic semiconductors often differ in the carrier mobility, and it is difficult to obtain organic semiconductor elements having uniform property.

A primary object of an organic semiconductor element in the present disclosure is to provide organic semiconductor elements having uniform property.

For achieving the above-described primary object, an organic semiconductor element in the present disclosure adopts the following configurations.

In the organic semiconductor element in the present disclosure, the organic semiconductor element includes an organic semiconductor. The organic semiconductor is formed as a single-crystal thin film, and the organic semiconductor element operates based on carrier mobility when a strain is given to at least the organic semiconductor.

In the organic semiconductor element in the present disclosure, the organic semiconductor is formed as the single-crystal thin film. The crystal structure of a single crystal is determined by the molecules, and therefore, basically, an identical crystal structure is obtained regardless of the production technique. Therefore, when the same strain is given, the same carrier mobility can be obtained. Accordingly, it is possible to obtain organic semiconductor elements having uniform property.

Here, the organic semiconductor may be formed as a thin film whose thickness is 200 nm or less, for example, 100 nm or 50 nm. It is preferable that the strain to be given to the organic semiconductor be in a range of 10% or less in a compression direction. Further, as the organic semiconductor, the organic semiconductor may be composed of a polycyclic aromatic compound with four or more rings, or a polycyclic compound with four or more rings including at least one unsaturated five-membered heterocyclic compound and a plurality of benzene rings.

In the organic semiconductor element in the present disclosure, the organic semiconductor may be kept in a state where a predetermined strain is applied in a movement direction of carriers. That is, the organic semiconductor is used while the carrier mobility is fixed in the state where the predetermined strain is applied. By using such an organic semiconductor, it is possible to obtain various semiconductor devices.

In the organic semiconductor element in the present disclosure, the organic semiconductor element may be operated based on mobility of carriers when a predetermined strain as a standard is given to the organic semiconductor and carrier mobility when a different strain from the predetermined strain is given to the organic semiconductor. Thereby, it is possible to use the organic semiconductor element as a sensor device.

DETAILED DESCRIPTION OF EMBODIMENTS

The following describes some aspects of the disclosure with reference to embodiment.

Figure 1:
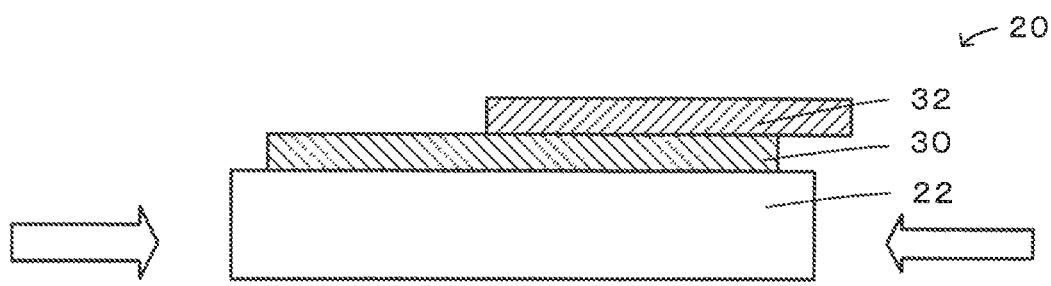
FIG. 1 is an explanatory diagram showing an exemplary configuration of an organic semiconductor element 20 according to a first embodiment of the present disclosure.

FIG. 1 is an explanatory diagram showing an exemplary configuration of an organic semiconductor element 20 that functions as a strain sensor according to a first embodiment of the present disclosure. The organic semiconductor element 20 includes a substrate 22, an organic semiconductor layer 30 formed on the substrate 22, and two gauge leads 32 formed on the organic semiconductor layer 30 (one of the two gauge leads 32 is not illustrated).

The substrate 22 is formed of a plastic (for example, polyethylene naphthalate), such that the thickness is 50 μm to 10 mm, for example, 100 μm to 200 μm.

The organic semiconductor layer 30 is formed such that the thickness is 200 nm or less, for example, 100 nm or 50 nm, as a single-crystal thin film of an organic semiconductor (for example, 3,11-didecyldinaphto [2,3-d:2',3'-d']benzo

[1,2-b:4,5-b']dithiophene (C10-DNBDT) having a structure shown in the following Formula (1)).

[Formula 1]

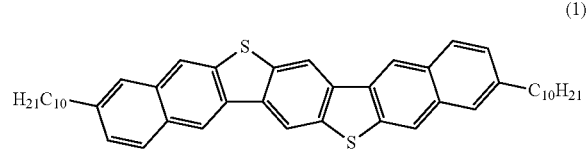

(1)

Figure 2:
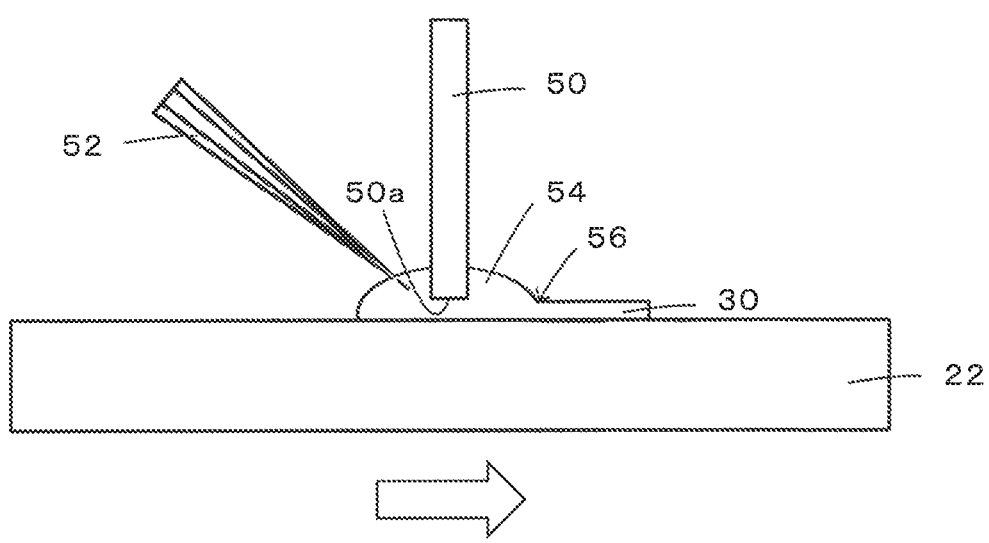
FIG. 2 is an explanatory diagram showing an example of how an organic semiconductor layer 30 is formed.

Here, a formation method for the organic semiconductor layer 30 will be described. FIG. 2 is an explanatory diagram showing an example of how the organic semiconductor layer 30 is formed. First, a blade 50 is arranged above the substrate 22, so as to be nearly perpendicular to the substrate 22. At this time, the blade 50 is arranged such that the distance between the substrate 22 and a tip 50a of the blade 50 is a predetermined distance (for example, 200 μm) that is greater than the thickness of the organic semiconductor layer 30 to be formed. Then, while a solution 54 in which the organic semiconductor is dissolved in an aromatic compound (for example, o-dichlorobenzene) as a solvent is supplied to the gap between the substrate 22 and the tip 50a of the blade 50 from the left side in FIG. 2 using a solution supply pipe 52, the substrate 22 is slowly moved in the right direction in the figure. Thereby, the solvent of the solution 54 at a portion away from the tip 50a of the blade 50 evaporates, so that the organic semiconductor layer 30 is formed as a single-crystal thin film. At this time, by matching the movement speed of the substrate 22 with the growth speed of the single crystal, it is possible to grow the single crystal from a growth point 56 in FIG. 2, such that the single crystal has a uniform thickness. Here, in the embodiment, the substrate 22 is moved in the right direction in the figure, but the blade 50 and the solution supply pipe 52 may be moved instead of the movement of the substrate 22.

Figure 3:
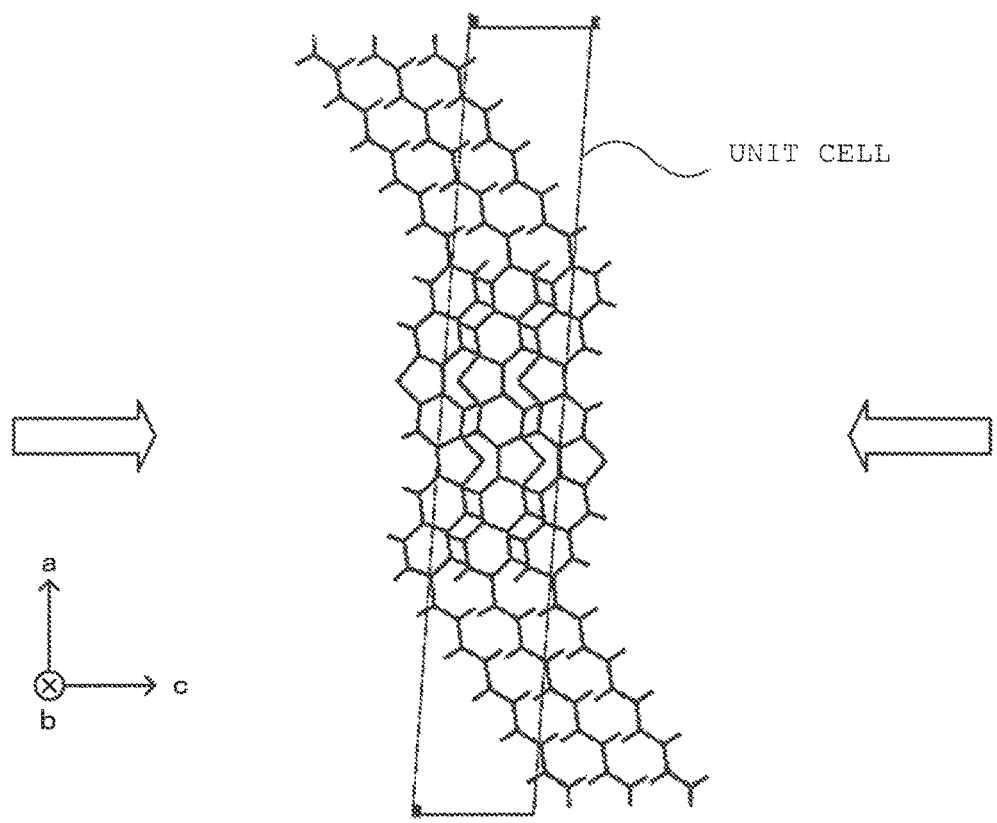
FIG. 3 is a schematic diagram schematically showing the view of the crystal structure of the organic semiconductor layer 30, as viewed from the b-axis direction.
Figure 4:
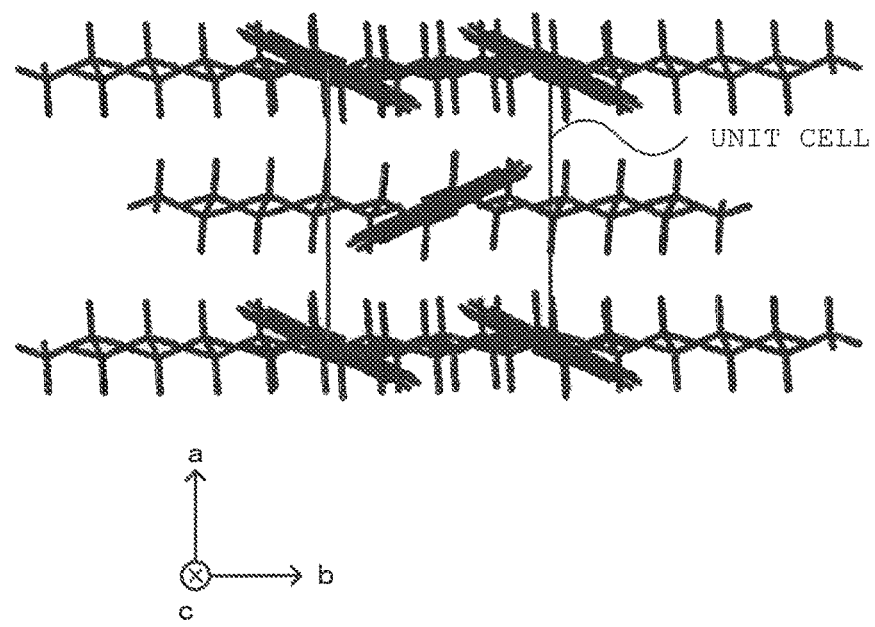
FIG. 4 is a schematic diagram schematically showing the view of the crystal structure of the organic semiconductor layer 30, as viewed from the a-axis direction.
Figure 5:
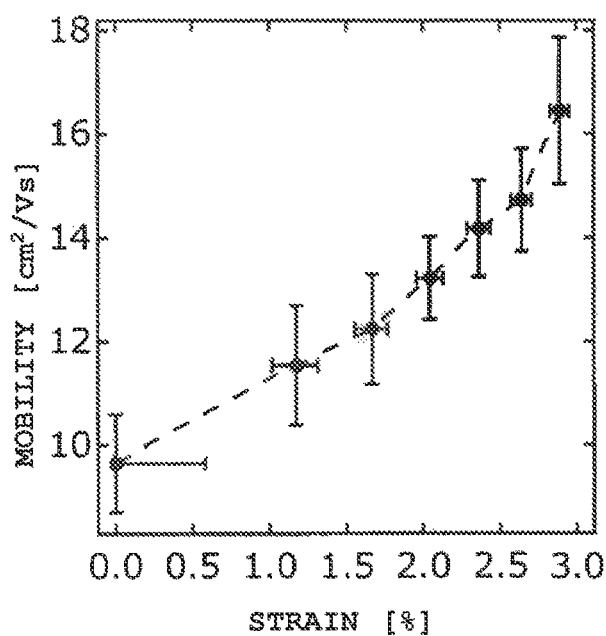
FIG. 5 is an explanatory diagram showing a relation between mobility of carriers and magnitude of a strain in the organic semiconductor layer 30.
Figure 6:
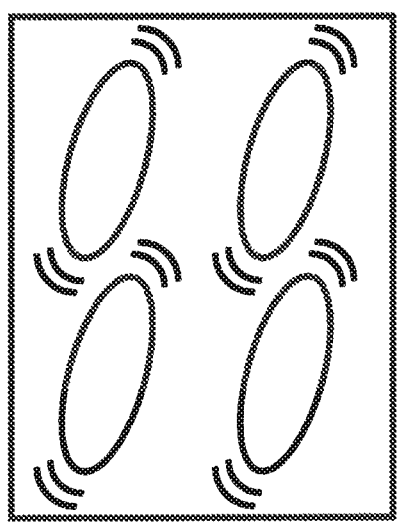
FIG. 6 is a schematic diagram schematically showing how molecules vibrate before and after a compressive stress is applied to a single-crystal organic semiconductor.
Figure 6:
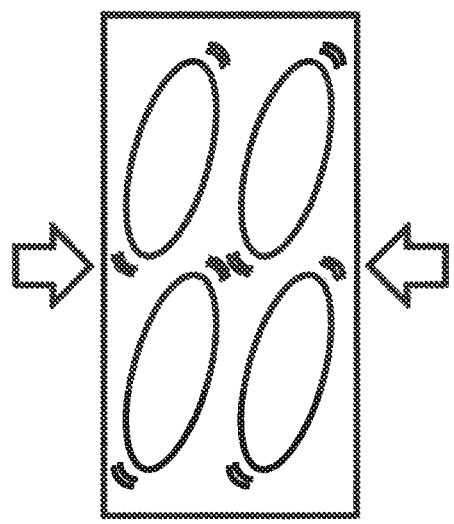

FIG. 3 is a schematic diagram schematically showing the view of the crystal structure of the organic semiconductor layer 30, as viewed from the b-axis direction, FIG. 4 is a schematic diagram schematically showing the view of the crystal structure of the organic semiconductor layer 30, as viewed from the a-axis direction, and FIG. 5 is an explanatory diagram showing a relation between carrier mobility and magnitude of a strain in the organic semiconductor layer 30. In FIGS. 3 and 4, the three crystal axes (the a-axis, the b-axis and the c-axis) are shown by arrows, and a unit cell is surrounded by a quadrangle. In the organic semiconductor layer 30, for example, when a compressive stress is applied in the direction (the direction shown by the broad arrows in FIG. 3) parallel to the c-axis in the crystal structure of the organic semiconductor and a strain is given to the organic semiconductor layer 30, the carrier mobility changes depending on the magnitude of the given strain, as shown in FIG. 5. The carrier mobility is determined depending on the magnitude of the strain to be given, and increases as the strain to be given increases. For example, the carrier mobility when the strain is 3% is 16.5 [cm$^2$/(V·s)], which is 1.7 times the carrier mobility when the strain is 0%. Generally, multi-crystal organic semiconductors differ in crystal structure, depending on the formation technique. Therefore, even when the same compressive stress is applied and the same strain is given, it is not possible to obtain the same carrier mobility. In contrast, in single-crystal organic semiconductors, the crystal structure is determined by the molecule. Therefore, basically, an identical crystal structure is obtained regardless of the formation technique, and it is possible to obtain the same carrier mobility when the same compressive stress is applied and the same strain is given. Therefore, the single-crystal organic semiconductors have uniform property with respect to the strain. As the reason for the increase in the carrier mobility, the following reason is conceivable. FIG. 6 is a schematic diagram schematically showing how molecules vibrate before and after a compressive stress is applied to the single-crystal organic semiconductor. When the compressive stress is applied to the single-crystal organic semiconductor, it is thought that a strain occurs to the crystal, molecules come closer to each other and the movement of the carrier in the organic semiconductor becomes easier so that the carrier mobility increases. Further, when molecules come closer to each other, the vibration of molecules becomes smaller. Therefore, it is thought that after the compressive stress is applied, as illustrated, the vibration of molecules becomes smaller, the movement of the carrier in the organic semiconductor becomes easier and the carrier mobility increases, compared to before the compressive stress is applied. Furthermore, the distance among molecules becomes closer as the strain to be given to the crystal increases, and therefore, the carrier mobility increases as the strain to be given to the crystal increases. Thus, the single-crystal organic semiconductor has a property of increasing the carrier mobility as the strain to be given increases, and this property is consistent regardless of the formation technique for the organic semiconductor. In the embodiment, since the organic semiconductor layer 30 is formed as the single-crystal thin film, the organic semiconductor layer 30 can have uniform property with respect to the strain (the property of increasing the carrier mobility as the strain to be given increases).

In the organic semiconductor element 20 configured in this way, the magnitude of the strain of an object is detected, in the following procedure. First, a predetermined voltage is applied to the gauge leads 32 in a state where the substrate 22 sticks with the object to be detected. When the strain of the object to be detected changes, the stress to be applied to the organic semiconductor layer 30 together with the substrate 22 changes, and the strain to be given to the organic semiconductor layer 30 changes. When the strain to be given to the organic semiconductor layer 30 changes, the carrier mobility in the organic semiconductor layer 30 changes depending on the magnitude of the strain, and the gauge current to flow through the gauge leads 32 changes. In the organic semiconductor element 20, by measuring the change in the gauge current, it is possible to measure the magnitude of the strain of the object to be detected. Further, the organic semiconductor layer 30, which is formed as the single-crystal thin film, has uniform property with respect to the strain, and therefore, it is possible to provide strain sensors having uniform property.

According to the above-described organic semiconductor element 20 in the first embodiment that functions as a strain sensor device, since the organic semiconductor layer 30 is formed as the single-crystal thin film, it is possible to measure the magnitude of the strain of the detection target. Further, since the organic semiconductor layer 30 is formed as the single-crystal thin film, it is possible to obtain the same carrier mobility when the same strain is given, and it is possible to provide strain sensors having uniform property.

In the first embodiment, the organic semiconductor element 20 functions as a strain sensor. However, the organic semiconductor element 20 is not limited to elements that function as a strain sensor in this way, and may be used as any element that operates based on the carrier mobility when the strain changes (the carrier mobility when a predetermined strain as the standard is given and the carrier mobility when a different strain from the predetermined strain is given), as exemplified by a pressure sensor that detects the pressure given to a pressure sensitive part, and a temperature sensor that detects temperature. For example, in the case of the use as a pressure sensor, the organic semiconductor element may be stuck to a sheet, and based on the current (the carrier mobility) that flows when the strain of the organic semiconductor element changes by the press of the sheet, the pressure given to the sheet may be detected. Further, in the case of the use as a temperature sensor, the organic semiconductor element may be bonded to metals having different thermal expansion coefficients similarly to a bi-metal, and based on the current (the carrier mobility) when the strain of the organic semiconductor element changes due to the difference in thermal expansion coefficient caused by the change in temperature, the temperature may be detected.

Figure 7:
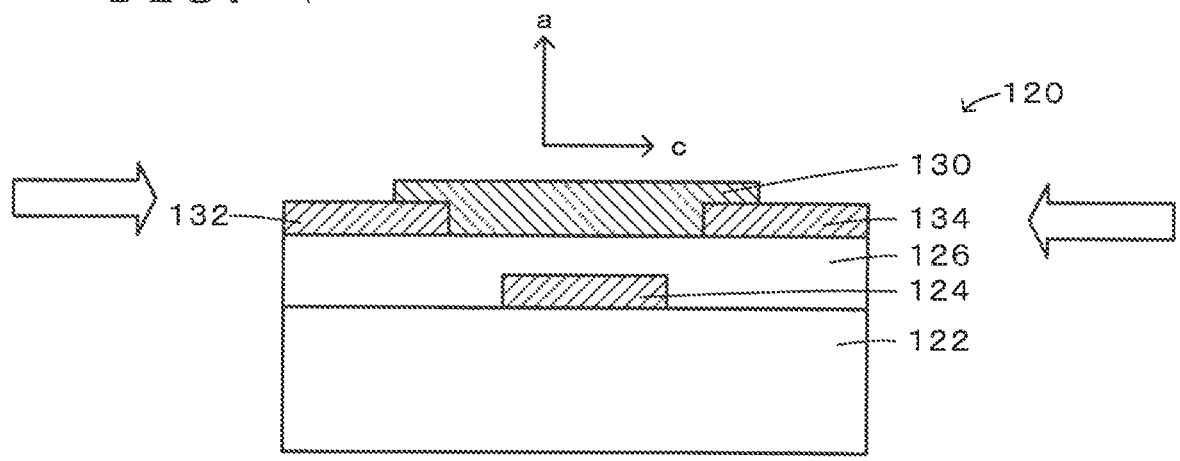
FIG. 7 is an explanatory diagram showing an exemplary configuration of an organic semiconductor element 120 according to a second embodiment of the present disclosure.

Next, an organic semiconductor element 120 in a second embodiment that functions as a transistor will be described. FIG. 7 is an explanatory diagram showing an exemplary configuration of the organic semiconductor element 120 according to the second embodiment of the present disclosure. The organic semiconductor element 120, which is configured as a top contact-bottom gate type field-effect transistor, includes a substrate 122, a gate electrode 124 formed on a predetermined region of the substrate 122, a gate insulating film 126 formed on the substrate 122 and the gate electrode 124, an organic semiconductor layer 130 formed on the gate insulating film 126 so as to be positioned above the gate electrode 124, and a source electrode 132 and drain electrode 134 formed on the gate insulating film so as to be positioned on both sides of the organic semiconductor layer 130.

The substrate 122 is formed of a plastic (for example, polyethylene naphthalate), such that the thickness is 50 µm to 10 mm, for example, 100 µm to 200 µm.

The gate electrode 124, the source electrode 132 and the drain electrode 134 are formed of a metal material such as gold. The gate electrode 124 is formed such that the thickness is 50 nm or less, for example, 40 nm or 30 nm. The source electrode 132 and the drain electrode 134 are formed such that the thickness is 50 nm or less, for example, 40 nm or 30 nm.

The gate insulating film 126 is formed of an insulating material (for example, polymethyl methacrylate), such that the thickness is 200 nm or less, for example, 150 nm or 100 nm.

The organic semiconductor layer 130 is formed such that the thickness is 200 nm or less, for example, 100 nm or 50 nm, as a single-crystal thin film of an organic semiconductor having the above-described structure shown in Formula (1). The organic semiconductor layer 130 is formed such that the c-axis of the crystal axes in the crystal structure shown in FIG. 3 is parallel to the orientation of a channel to be formed, and is kept in a state where a predetermined strain is applied by applying a compressive stress in the c-axis direction. Here, the "predetermined strain" only needs to be a strain by which the organic semiconductor layer 130, the substrate 122 or the gate insulating film 126 is not broken, and in the embodiment, a strain of 10% or less in the compression direction, for example, a strain of 3% in the compression direction can be used.

Figure 8:
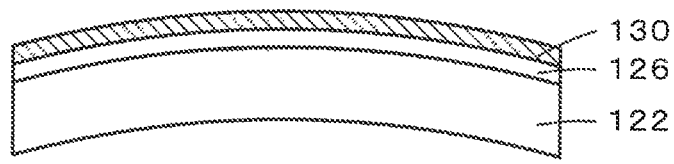
FIG. 8 is an explanatory diagram showing an exemplary formation method for an organic semiconductor layer 130.

Here, a formation method for the organic semiconductor layer 130 will be described. FIG. 8 is an explanatory diagram showing an exemplary formation method for the organic semiconductor layer 130. First, as illustrated, a single-crystal thin film of the organic semiconductor (the organic semiconductor layer 30) is formed in the right-left direction in the figure, in a state where the substrate 122 having the gate insulating film 126 formed is bent. Thereafter, the substrate 122 is stretched until the substrate 122 becomes planar, and the compressive stress is applied to the thin film. Thereby, the organic semiconductor layer 130 kept in the state where the predetermined strain is applied is formed. As the method for keeping the organic semiconductor layer 130 in a state where a predetermined strain is applied, other than the method exemplified in FIG. 8, it is allowable to use another method such as a method of forming a single-crystal thin film of the organic semiconductor in a state where the substrate 122 is heated and is thermally expanded and thereafter thermally contracting the substrate 122 at normal temperature.

Since the organic semiconductor layer 130 is formed as the single-crystal thin film in this way, it is possible to obtain the same carrier mobility when the same compressive stress is applied to and the same strain is given to the organic semiconductor layer 130. Accordingly, the organic semiconductor layer 130 can have uniform property with respect to the strain.

The organic semiconductor element 120 configured in this way operates as a transistor, when a channel is formed in the organic semiconductor layer 130 by applying voltages for operation to the gate electrode 124, the source electrode 132 and the drain electrode 134 respectively. The organic semiconductor layer 130, which is formed as the single-crystal thin film, has uniform property with respect to the strain, and therefore, it is possible to provide transistors having uniform property. Further, since the organic semiconductor layer 130 is kept in the state where the strain is applied, the carrier mobility is higher compared to when the strain is not applied. Therefore, it is possible to make a larger current flow between the source electrode 132 and the drain electrode 134, and it is possible to provide a transistor having a higher drive power.

According to the above-described organic semiconductor element 120 in the second embodiment that functions as a transistor, since the organic semiconductor layer 130 is formed as the single-crystal thin film, it is possible to provide a transistor having a high drive power. Further, since the organic semiconductor layer 130 is formed as the single-crystal thin film, it is possible to obtain the same carrier mobility when the same strain is given, and it is possible to provide transistors having uniform property.

In the second embodiment, the organic semiconductor element 120 is configured as a top contact-bottom gate type field-effect transistor, but may be configured as any type of transistor that can be formed on an inorganic semiconductor such as silicon and gallium nitride, as exemplified by a top contact-top gate type field-effect transistor. Further, the organic semiconductor element is not limited to such transistor, and may be used as any element that can be kept in a state where a predetermined strain is applied in the movement direction of the carrier.

In the organic semiconductor elements 20, 120 in the first and second embodiments, the organic semiconductor layers 30, 130 are formed of the organic semiconductor having the above-described structure in Formula (1). However, as the organic semiconductor, for example, a polycyclic aromatic compound with four or more rings or a polycyclic compound with four or more rings including one or a plurality of unsaturated five-membered heterocyclic compounds and a plurality of benzene rings can be used. For example, any structure in the following Formula (2) to Formula (14) may be adopted. In Formula (2) to Formula (14), as R, a straight alkyl, a branched alkyl, a fluorinated straight/branched alkyl, triisopropylsilylethynyl, phenyl or the like can be used.

[Formula 2]

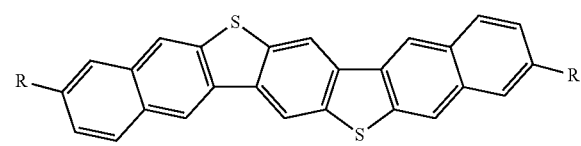

(2)

[Formula 3]

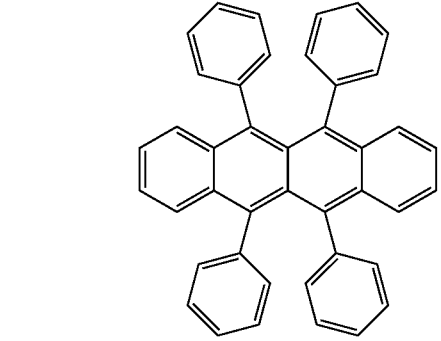

(3)

[Formula 4]

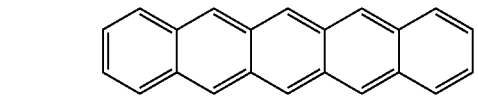

(4)

[Formula 5]

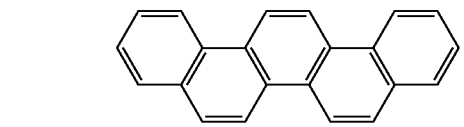

(5)

[Formula 6]

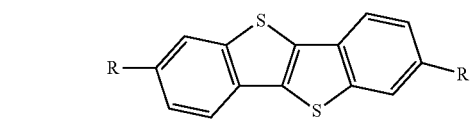

(6)

[Formula 7]

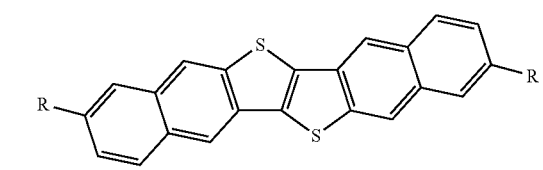

(7)

[Formula 8]

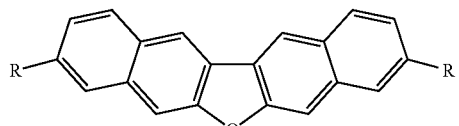

(8)

[Formula 9]

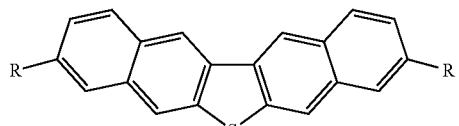

(9)

[Formula 10]

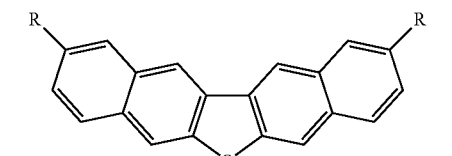

(10)

[Formula 11]

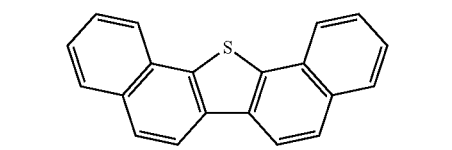

(11)

[Formula 12]

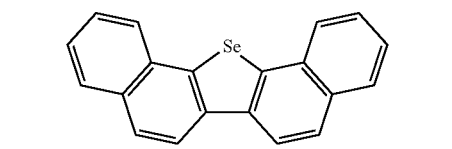

(12)

[Formula 13]

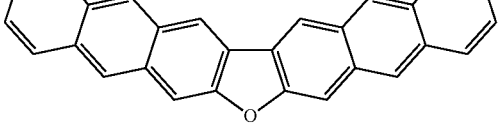

(13)

[Formula 14]

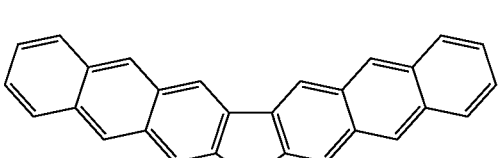

(14)

There may be many other modifications, changes, and alterations without departing from the scope or spirit of the main characteristics of the present disclosure.

INDUSTRIAL APPLICABILITY

The present disclosure can be utilized in production industries for an organic semiconductor element, and the like.

The invention claimed is:

1. An organic semiconductor element comprises an organic semiconductor, wherein
    the organic semiconductor is formed as a thin film of single-crystal composed of a polycyclic compound with four or more rings including at least one unsaturated five-membered heterocyclic compound and a plurality of benzene rings,
    the organic semiconductor has band conductivity being a carrier transfer mechanism in high mobility organic semiconductor having carrier mobility of greater than or equal to 9.7 cm$^2$/Vs,
    at least one benzene ring is arranged on both sides of the unsaturated five-membered heterocyclic compound, and
    the organic semiconductor element operates based on carrier mobility when a compressive stress is applied in only one direction to the organic semiconductor and a strain given to at least the organic semiconductor changes.

2. The organic semiconductor element according to claim 1, wherein
    the thin film of single-crystal has a unit cell with an a-axis, a b-axis and a c-axis, the c-axis being orthogonal to a direction in which layers of the polycyclic compound are stacked in the thin film of single-crystal,
    the organic semiconductor element operates based on carrier mobility when the compressive stress is applied in the direction parallel to the c-axis of the unit cell of the thin film of single-crystal and a predetermined strain as a standard is given to the organic semiconductor, and carrier mobility when the compressive stress is applied in the direction parallel to the c-axis of the unit cell of the thin film of single-crystal and a different strain from the predetermined strain is given to the organic semiconductor, wherein the predetermined strain is selected from values between 0% and 10%.

3. The organic semiconductor element according to claim 1, wherein
    the polycyclic compound has a bent molecular structure.

4. The organic semiconductor element according to claim 1, wherein
    the organic semiconductor is formed as a thin film having a thickness of 200 nm or less.

5. The organic semiconductor element according to claim 1, wherein
    the strain to be given to the organic semiconductor is in a range of 10% or less in a compression direction.

6. The organic semiconductor element according to claim 1, wherein
    the polycyclic compound has a structure shown in one of Formulae (I) to (IX):

Formula I

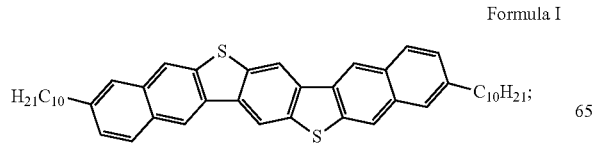

Formula II

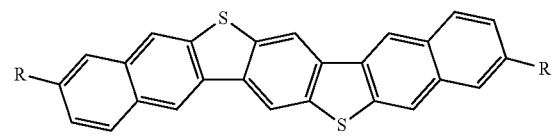

where R is a straight alkyl, a branched alkyl, a fluorinated straight/branched alkyl, triisopropylsilylethynyl, or phenyl;

Formula III

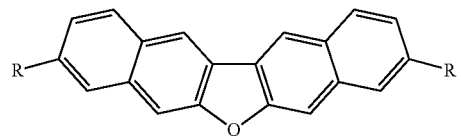

where R is a straight alkyl, a branched alkyl, a fluorinated straight/branched alkyl, triisopropylsilylethynyl, or phenyl;

Formula IV

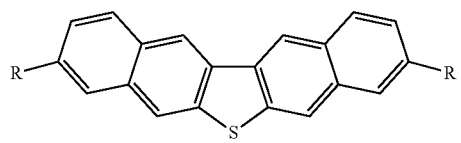

where R is a straight alkyl, a branched alkyl, a fluorinated straight/branched alkyl, triisopropylsilylethynyl, or phenyl;

Formula V

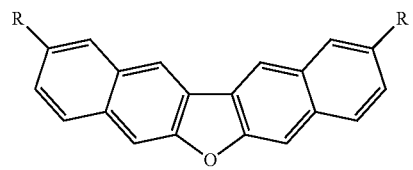

where R is a straight alkyl, a branched alkyl, a fluorinated straight/branched alkyl, triisopropylsilylethynyl, or phenyl;

Formula VI

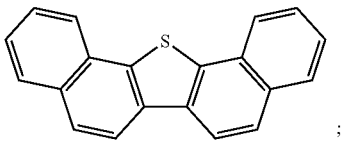

;

Formula VII

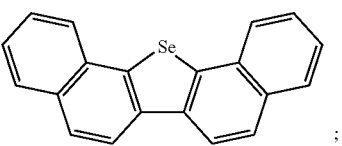

;

-continued

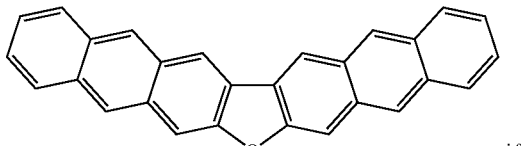

Formula VIII

; and

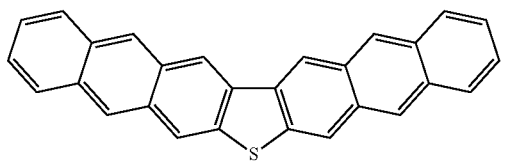

Formula IX

.

7. The organic semiconductor element according to claim 1, wherein
the thin film of single-crystal has a unit cell with an a-axis, a b-axis and a c-axis, the c-axis being orthogonal to a direction in which layers of the polycyclic compound are stacked in the thin film of single-crystal, and
the direction in which is the compressive stress is applied is a direction that is parallel to the c-axis of the unit cell of the thin film of single-crystal.

8. An organic semiconductor element comprises an organic semiconductor, wherein
the organic semiconductor is formed as a thin film of single-crystal composed of a polycyclic compound with four or more rings including at least one unsaturated five-membered heterocyclic compound and a plurality of benzene rings,
the organic semiconductor has band conductivity being a carrier transfer mechanism in high mobility organic semiconductor having mobility of carrier of greater than or equal to 9.7 $cm^2/Vs$,
at least one benzene ring is arranged on both sides of the unsaturated five-membered heterocyclic compound, and
the organic semiconductor element operates based on mobility of carrier when a compressive stress is applied in only one direction to the organic semiconductor and a strain given to at least the organic semiconductor changes.

9. The organic semiconductor element according to claim 8, wherein
the thin film of single-crystal has a unit cell with an a-axis, a b-axis and a c-axis, the c-axis being orthogonal to a direction in which layers of the polycyclic compound are stacked in the thin film of single-crystal, and
the direction in which is the compressive stress is applied is a direction that is parallel to the c-axis of the unit cell of the thin film of single-crystal.

* * * * *